(12) United States Patent
Zhang et al.

(10) Patent No.: US 10,937,905 B2
(45) Date of Patent: Mar. 2, 2021

(54) TRANSISTOR HAVING DOUBLE ISOLATION WITH ONE FLOATING ISOLATION

(71) Applicant: Texas Instruments Incorporated, Dallas, TX (US)

(72) Inventors: Yongxi Zhang, Plano, TX (US); Philip L. Hower, Concord, MA (US); Sameer P. Pendharkar, Allen, TX (US); John Lin, Chelmsford, MA (US); Guru Mathur, Plano, TX (US); Scott Balster, Dallas, TX (US); Victor Sinow, Oakland, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 722 days.

(21) Appl. No.: 14/286,202

(22) Filed: May 23, 2014

(65) Prior Publication Data

US 2015/0340496 A1 Nov. 26, 2015

(51) Int. Cl.
*H01L 27/02* (2006.01)
*H01L 29/78* (2006.01)
(Continued)

(52) U.S. Cl.
CPC ........ *H01L 29/7841* (2013.01); *H01L 21/761* (2013.01); *H01L 29/1095* (2013.01);
(Continued)

(58) Field of Classification Search
CPC ........... H01L 21/76267; H01L 29/0878; H01L 29/7835; H01L 29/1083; H01L 29/7816; H01L 29/1095; H01L 21/7624; H01L 21/76283; H01L 29/66613; H01L 29/66681; H01L 29/7824; H01L 29/0696; H01L 29/0852; H01L 29/1045; H01L 29/66674; H01L 29/66712; H01L 29/7801; H01L 29/7802; H01L 29/7809; H01L 29/781; H01L 29/7812
(Continued)

(56) References Cited

U.S. PATENT DOCUMENTS

| 8,390,057 B1 | 3/2013 | Zuniga et al. |
| 2009/0261421 A1* | 10/2009 | Gogoi ................ H01L 29/7816 257/378 |
| 2009/0261446 A1* | 10/2009 | Gogoi ................ H01L 29/7803 257/500 |
| 2011/0049621 A1* | 3/2011 | Lotfi ............... H01L 21/823807 257/337 |

(Continued)

*Primary Examiner* — Cuong B Nguyen
*Assistant Examiner* — Samuel Park
(74) *Attorney, Agent, or Firm* — Andrew R. Ralston; Charles A. Brill; Frank D. Cimino

(57) ABSTRACT

A semiconductor device includes at least a first transistor including at least a second level metal layer (second metal layer) above a first level metal layer coupled by a source contact to a source region doped with a first dopant type. The second level metal layer is coupled by a drain contact to a drain region doped with the first dopant type. A gate stack is between the source region and drain region having the second level metal layer coupled by a contact thereto. The second level metal layer is coupled by a contact to a first isolation region doped with the second dopant type. The source region and drain region are within the first isolation region. A second isolation region doped with the first dopant type encloses the first isolation region, and is not coupled to the second level metal layer so that it electrically floats.

20 Claims, 4 Drawing Sheets

(51) Int. Cl.
*H01L 29/66* (2006.01)
*H01L 21/761* (2006.01)
*H01L 29/10* (2006.01)
*H01L 29/423* (2006.01)

(52) U.S. Cl.
CPC .. *H01L 29/66659* (2013.01); *H01L 29/66681* (2013.01); *H01L 29/7816* (2013.01); *H01L 29/7835* (2013.01); *H01L 29/42368* (2013.01)

(58) Field of Classification Search
USPC ....... 257/335–344, 127, 170, 409, 452, 544, 257/549, 490, 494, 495, 552–556, 141; 438/316, 335
See application file for complete search history.

(56) References Cited

U.S. PATENT DOCUMENTS

| | | | | |
|---|---|---|---|---|
| 2012/0276701 | A1* | 11/2012 | Yedinak | H01L 29/872 438/270 |
| 2013/0328103 | A1* | 12/2013 | Salcedo | H01L 27/0262 257/121 |
| 2014/0001549 | A1* | 1/2014 | Bode | H01L 29/66659 257/337 |
| 2014/0061731 | A1* | 3/2014 | Chen | H01L 29/872 257/272 |
| 2014/0368943 | A1* | 12/2014 | Miyagoe | H01L 27/0921 360/46 |
| 2014/0374773 | A1* | 12/2014 | Ryu | H01L 21/82388 257/77 |

\* cited by examiner

US 10,937,905 B2

TRANSISTOR HAVING DOUBLE ISOLATION WITH ONE FLOATING ISOLATION

FIELD

Disclosed embodiments relate to power metal oxide semiconductor (MOS) transistors having double junction isolation.

BACKGROUND

Asymmetric source/drain MOS transistors such as drain extended MOS (DEMOS) or laterally diffused MOS (LDMOS) transistors have drain structures capable of operating at higher voltages as compared to conventional symmetric MOS transistors. The higher operating voltages provided by DEMOS and LDMOS transistors enable use in a variety of applications not generally possible using conventional symmetric MOS transistors, including for motor drives as an example.

In a typical motor drive application a level shifting circuit is coupled to a high side gate driver which drives the gate of the high side transistor of a half-bridge circuit with a pulse width modulation (PWM) signal, and a low side gate driver drives the gate of the low side transistor of the half-bridge circuit with a PWM complement signal. The high side gate driver comprises a pair of LDMOS or DEMOS transistors stacked in series, where the high side of the high side transistor is connected to a node referred to as a Boot node which is on the cathode side of a diode in series with $V_{CC}$, and the low side of the low side transistor of the high side gate driver is connected to the switch (SW) node of the half-bridge which is at the node between the high side and low side half-bridge transistors.

LDMOS and DEMOS transistors may utilize vertical junction isolation. However, for example for NMOS power transistors, such devices may only meet a certain rating requirement instead of a higher rating needed in applications such as for high side gate drivers for motor drive due to a vertical punch through that can occur when using a BiMOS process flow which can occur through a p+ buried layer (PBL) between an nwell above the PBL and an n+ buried layer (NBL) below the PBL. Lateral junction isolation is a known alternative to vertical junction isolation, including double junction isolation including both a p-isolation ring and an n-isolation ring, which can further raise the voltage rating of the transistor by several volts.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize double lateral junction isolation with a p-isolation (PISO) and an outer n-isolation (NISO) ring can raise the voltage ratings of power transistors including drain extended MOS (DEMOS) and laterally diffused MOS (LDMOS) transistors. However, when double lateral junction isolated DEMOS and LDMOS are used in circuits such as for the low side gate drive transistor of a high side gate driver which drives the gate of the high side MOS transistor of a half-bridge circuit, during dynamic circuit operation (i.e., switching) negative undershoot of the NISO node (corresponding to the NISO ring) of the low side gate drive transistor can occur which can result in injecting minority carriers into the substrate, such as electrons into a p-substrate for NMOS transistors.

Disclosed embodiment replace the low side LDMOS or DEMOS transistor of the high side gate driver with a double lateral junction isolation transistor having a floating NISO node, which can be implemented in one embodiment by not connecting the NISO node to a bond pad. The inventive approach of floating the NISO node is opposite to conventional circuit design thought which always seeks to tie every node to some potential.

BRIEF DESCRIPTION OF THE DRAWINGS

Reference will now be made to the accompanying drawings, which are not necessarily drawn to scale, wherein:

FIG. 2A is a cross sectional depiction of a semiconductor device including an example floating NISO LDMOS/DEMOS transistor and a high side gate drive transistor (shown as a block) according to an example embodiment, while

DETAILED DESCRIPTION

Figure 1A:
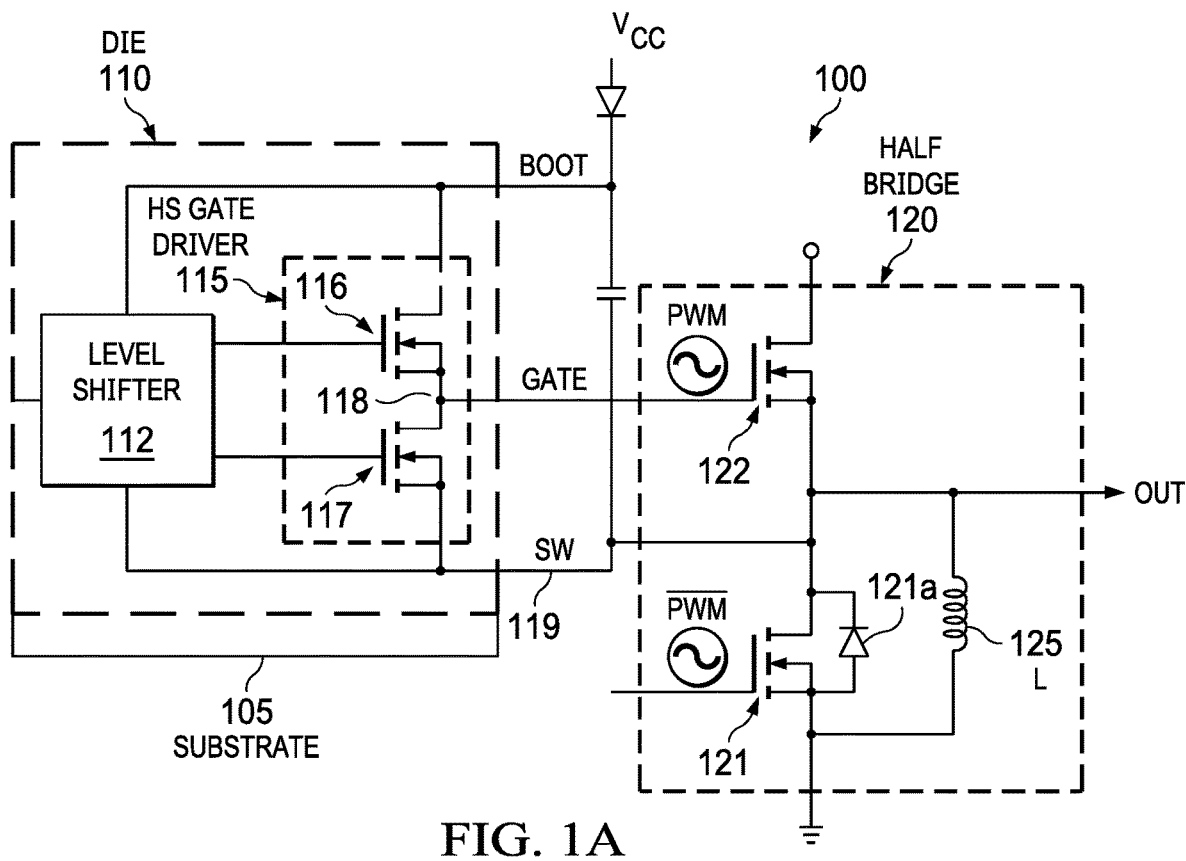
FIG. 1A depicts a circuit combination including (i) an IC die including a level shift circuit block coupled to a high side gate driver driving the gate of a high side transistor of (ii) a half-bridge circuit, where the low side gate drive transistor is a disclosed double lateral junction isolated LDMOS or DEMOS transistor having a floating NISO node, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Figure 1B:
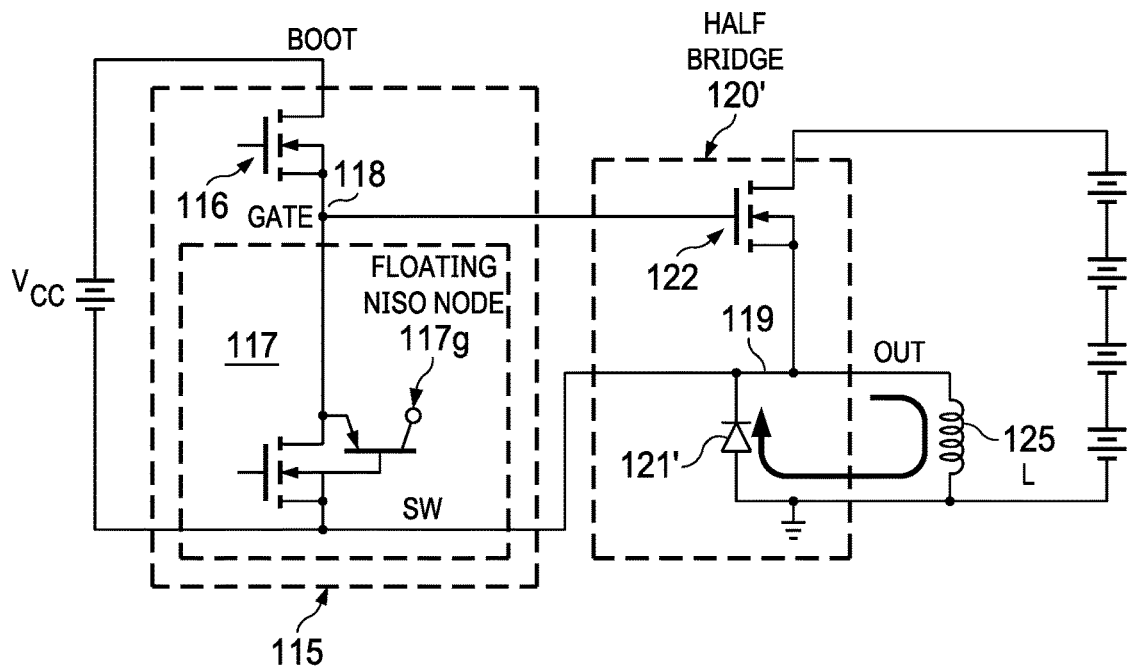
FIG. 1B depicts the dynamic operation of the floating NISO LDMOS/DEMOS transistor of the gate driver with the low side transistor (switch) of the half-bridge circuit shown in FIG. 1A being replaced by a power diode, during a switching event that results in negative undershoot (below ground voltage) of the SW node, according to an example embodiment.

FIG. 1A depicts a circuit combination 100 including (i) an IC die 110 formed on a semiconductor surface of a substrate 105 including a level shifter circuit block 112 coupled to a high side gate driver 115 (HS gate driver 115) driving the gate of a high side transistor (switch) 122 of (ii) a half-bridge circuit 120 with the pulse width modulation (PWM) signal shown, according to an example embodiment. HS gate driver 115 includes a high side gate drive transistor 116 and a low side gate drive transistor 117, with a gate node 118 between the high side gate drive transistor 116 and low side gate drive transistor 117. The low side gate drive transistor 117 is a disclosed double lateral junction isolated LDMOS or DEMOS transistor having a floating NISO node (hereafter floating NISO LDMOS/DEMOS transistor 117). The low side transistor (switch) 121 of the half-bridge circuit 120 is shown receiving a PWM complement signal, which is typically provided by a low side gate driver (not shown in FIG. 1A). The low side transistor (switch) 121 of the half-bridge circuit 120 can be either a power MOSFET or a power diode, with FIG. 1A showing the power MOSFET case and FIG. 1B showing the power diode case.

Although NMOS transistors are described in FIG. 1A and other FIGS. herein, it should be clear to one having ordinary skill in the art to use the information disclosed herein for PMOS transistors, by n-doped regions being substituted by p-doping and vice versa. As used herein, when a diffused region is referred to be doped with a particular dopant type, this means a region in the semiconductor surface where doping concentration of the dopant type referred to (e.g., n-type) is higher than the doping concentration of dopants of the second type (e.g., p-type).

General aspects that make transistors LDMOS/DEMOS transistors and processing to form the same can be found in a variety of references, including U.S. Pat. No. 8,470,675 entitled "thick gate oxide for LDMOS and DEMOS" to Sridhar et al., which is incorporated herein by reference. Briefly, a DEMOS transistor has an extended drain by adding a drain drift region between the drain and the channel of the device, trapping the majority of the electric field in this region instead of the channel region, and as used herein also includes a variant known as a Double-Diffused Drain MOS (DDDMOS). A LDMOS transistor uses a drain drift region created by an extra doping similar to the DEMOS transistor structure.

High side gate drive transistor 116 can also be a double lateral junction isolated LDMOS or DEMOS transistor. The half-bridge circuit 120 is shown as being a separate circuit (external) from that of the IC die 110 (level shifter circuit block 112 coupled to HS gate driver 115). The output of the half-bridge circuit 120 is shown as OUT which is for driving a resistive load that is developed across the inductor 125 shown. The arrangement at the output of the half-bridge can vary from the arrangement shown in FIGS. 1A and 1B to be embodied in different topologies, such as an inductor to in series with a capacitor to ground, where OUT is taken across the capacitor. Such an alternate topology is also recognized to lead to negative undershoot occurring as described herein In a typical half-bridge circuit, when the high side transistor (switch) 122 is off and low side transistor (switch) 121 is on, inductive current from the inductor 125 can flow through the body diode 121a of the low side transistor (switch) 121 in FIG. 1A or power diode 121' shown in FIG. 1B which will force the switch (SW) node shown as 119 (SW node 119) to undershoot to a voltage level below ground. Undershoot of the switch node 119 is recognized to require full isolation of the source and drain of the low side gate drive transistor 117 from ground and the boot node. If the nodes of the low side gate drive transistor 117 are not fully isolated, which is generally the case absent a dielectric isolation scheme or double junction isolation, this results in electrons being injected into the ground (i.e., which may be electrically common to a high resistance p-substrate shared by all devices on IC die 110) caused by negative undershoot during switching of the half-bridge circuit 120 that can result in malfunction of and damage to the low side gate drive transistor 117. Improved negative undershoot immunity is recognized as being important particularly for high voltage (e.g., >15 V) high side gate driver IC applications, such as for motor drive applications.

FIG. 1B depicts dynamic operation of the floating NISO LDMOS/DEMOS transistor 117 of the HS gate driver 115 with the low side transistor (switch) 121 of the half-bridge circuit 120 shown in FIG. 1A replaced by a power diode 121' with the half-bridge circuit now shown as 120', during a switching event that results in negative undershoot (below ground) of the SW node 119, according to an example embodiment. The n-collector of parasitic npn bipolar transistor of the floating NISO LDMOS/DEMOS transistor 117 corresponds to the NISO node 117g (also shown in FIG. 2 described below) which is shown floating in FIG. 1B, with inductor current flowing through the power diode 121'.

The source of the floating NISO LDMOS/DEMOS transistor 117 is directly tied to the SW node 119 of the half-bridge circuit 120' (or half-bridge 120 in FIG. 1A); so that its drain will follow the source having the potential of the switch node 119 since gate of the floating NISO LDMOS/DEMOS transistor 117 renders the transistor on. With the floating of NISO node 117g, both the source and drain of floating NISO LDMOS/DEMOS transistor 117 are fully isolated from the boot node and ground (Psub), thus providing improved negative undershoot immunity for floating NISO LDMOS/DEMOS transistor 117 compared to conventionally tying the NISO to a fixed potential, such as to a source potential.

The junction isolation between the NISO node 117g and the boot node may be 20V rated and 700V rated between the NISO node 117g and the p-substrate (see substrate 105 in FIG. 2), with a high voltage rating such as a 700V rating enabled by a lightly doped substrate, such as a doping level $<5\times10^{14}$ cm$^{-3}$, including $\leq 2\times10^{14}$ cm$^{-3}$ in some embodiments. In contrast, if the NISO node is conventionally connected to a fixed potential such as the source potential (e.g., GND), the LDMOS/DEMOS transistor is likely to be subject to a low breakdown voltage due to punch through between the drain's NWELL and NISO node 117g particularly for devices built-in the thin p-substrate material which may be used for advanced low voltage (40V or below) Linear BiCMOS (LBC) or Bipolar-CMOS-DMOS (BCD) technologies, such as a breakdown of 12 V or less. Accordingly, when the boot node/$V_{CC}$ is 15 V or more, the conventional LDMOS/DEMOS transistor may experience a junction breakdown that is potentially destructive.

Figure 2A:
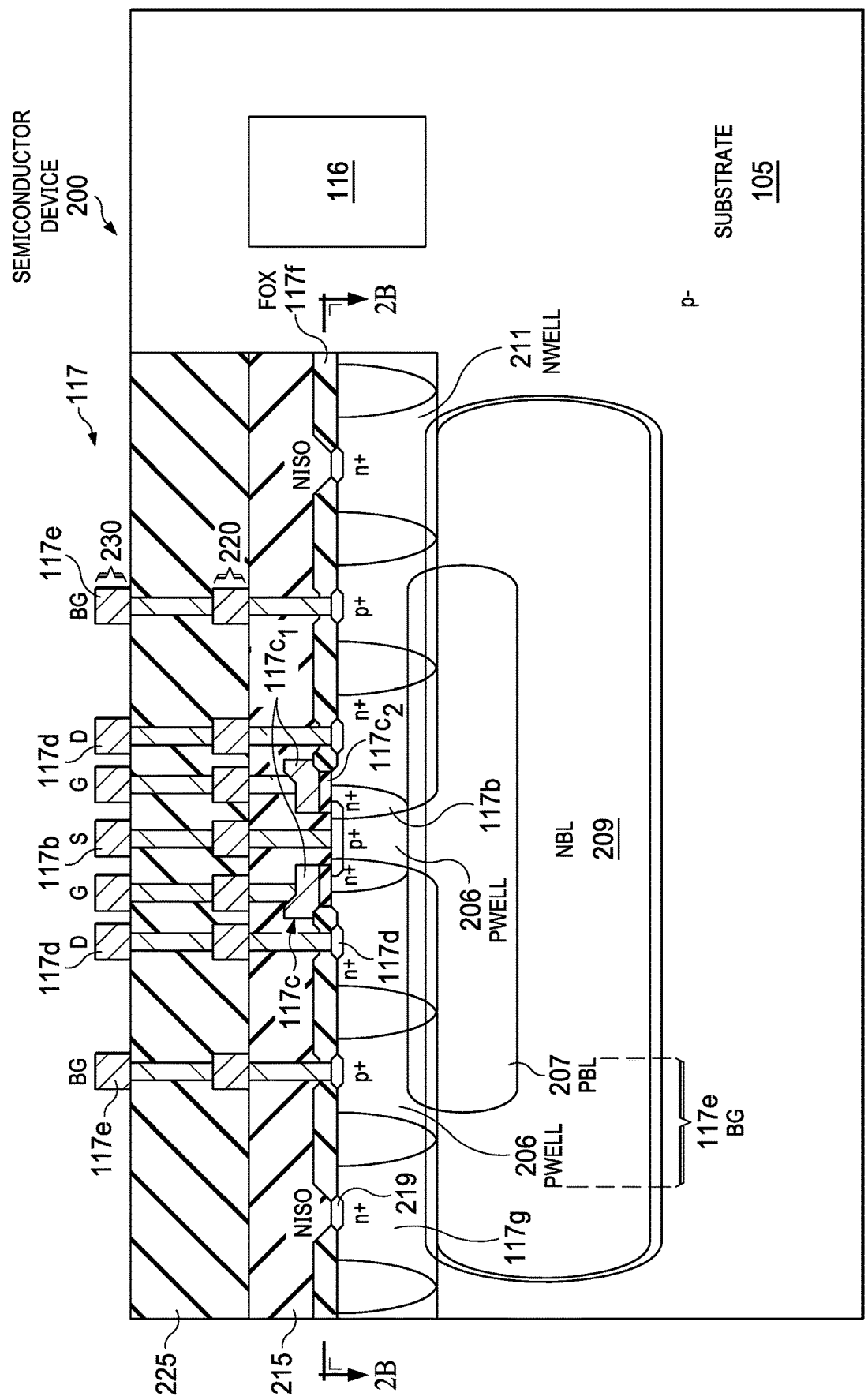
Figure 2B:
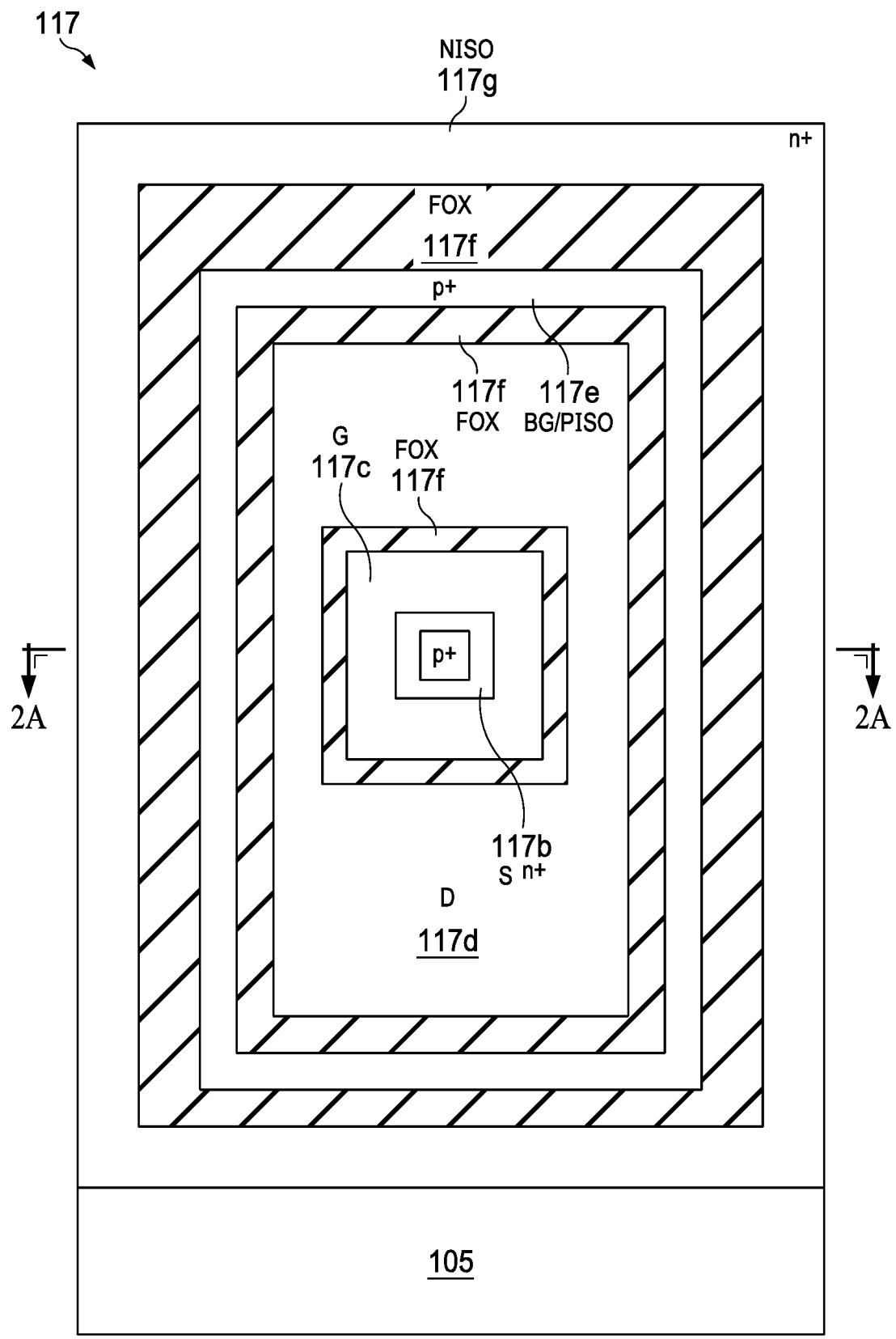
FIG. 2B is an enhanced top view depiction of the example floating NISO LDMOS/DEMOS transistor shown in FIG. 2A without the pre-metal dielectric or the metallization shown.

FIG. 2A is a cross sectional depiction of a semiconductor device 200 including an example HS gate driver including a disclosed floating NISO LDMOS/DEMOS transistor 117 and the high side gate drive transistor 116 shown for simplicity as a block, according to an example embodiment, while FIG. 2B is a top view depiction of the example floating NISO LDMOS/DEMOS transistor 117 shown in FIG. 2A without the pre-metal dielectric (PMD) 215 or the metallization shown. Floating NISO LDMOS/DEMOS transistor 117 is shown formed in a semiconductor surface of a substrate 105 shown as a p-substrate. The substrate 105 and/or semiconductor surface can generally comprise silicon, silicon-germanium, or other semiconductor material including III-V or II-VI semiconductor materials.

One particular arrangement is a silicon/germanium (SiGe) semiconductor surface on a silicon substrate. When the p-substrate is lightly doped, such as a doping density of $<5\times10^{14}$ cm$^{-3}$ so that the level shifter on the IC die 110 can provide a high breakdown voltage, the issue of minority carrier injection results in a higher voltage drop causing additional voltage level undershoot which floating NISO LDMOS/DEMOS transistor 117 needs to sustain as compared to other technologies with a more highly doped substrate, such as a p+ substrate. Field oxide (FOX) is shown as FOX 117*f* in FIG. 2B formed from LOCOS with its characteristic beaks can also be embodied as shallow trench isolation (STI) field oxide.

As shown in FIG. 2A, floating NISO LDMOS/DEMOS transistor 117 includes a pre-metal dielectric 215 having contacts therethrough, such as filled with tungsten (W) plugs, a first metal interconnect layer 220 coupled to the contacts, a first interlayer dielectric (ILD) 225 on the first metal interconnect layer 220, and at least a second metal interconnect layer 230 on the first ILD 225. As used herein, a contact is an interface between a semiconductor material and a metallic material. Contacts shown include an optional silicide layer 219. Although the metal layers in FIG. 2A are not shown damascened into the respective dielectrics, such as used for copper metallization, disclosed embodiments also include damascened metal layers.

The contacts shown in FIG. 2A include a contact to the source region 117*b* doped with a dopant of a first dopant type shown as an n+ source region (S) 117*b*, a drain region (D) 117*d* doped n+ being unsymmetrical with the S 117*b* and including a drain drift region between the n+ contact to the D 117*d* and the gate stack 117*c*. The contact over the n+ S 117*b* also provides a p+ contact to the back gate (BG) 117*e* through its pwell 206 region and PBL 207 which provides a p-isolation (PISO) ring (thus providing a bias for the BG 117*e*/PISO) which can be referred to as a "source dwell" (dwell stands for double diffused pwell) that provides a low resistance vertical connection to the p+ BL (PBL) 207. Accordingly, BG 117*e* need not have the contact shown for biasing as it is tied to the source 117*b*. A gate stack 117*c* including a gate electrode (e.g., doped polysilicon) 117*c*$_1$ on a gate dielectric 117*c*$_2$ is between the S 117*b* and the D 117*d*. Although not shown, there can be dual gates.

BG 117*e* also includes a p+ contact to a pwell 206 beyond the D 117*d* that couples to the PBL 207 shown. The S 117*b* and D 117*d* are within the BG 117*e* and may be enclosed by BG 117*e* as shown in FIG. 2A. Although the PBL 207 is shown extending over the full area under the D 117*d*, S 117*b* and gate stack 117*c*, PBL 207 can optionally be more limited in extent provided it provides proper isolation between nwell of the D 117*d* and the NBL 209/NISO node 117*g*, and is connected to the pwell 206 region under the contact to the source 117*b* (source dwell).

A second isolation region shown as the NISO node 117*g* includes an n+ contact to a nwell 211 that couples to an n+BL (NBL) 209, where NISO node 117*g* encloses the BG 117*e* (see FIG. 2B described below). Field oxide (FOX) 117*f* is shown between respective regions. NISO node 117*g* is shown without any contact through the PMD 215 so that it is electrically floating, which is more generally not coupled to the second level metal interconnect layer 225, yet more generally not connected to the upper metal interconnect layer so that there is no connection to any bond pad. Accordingly, for example, there can be contacts for connecting to only the first metal interconnect layer 220 for NISO node 117*g* so that NISO node 117*g* will still be electrically floating.

Disclosed embodiments can be embodied as chips including both a gate driver having a disclosed floating NISO LDMOS/DEMOS transistor 117 and the half-bridge as shown in FIG. 1A. Other embodiments include a gate driver chip including a high side gate drive transistor 116 a disclosed floating NISO LDMOS/DEMOS transistor 117 as the lower high side gate drive transistor, and a floating NISO LDMOS/DEMOS transistor 117 chip as a discrete device.

EXAMPLES

Figure 3:
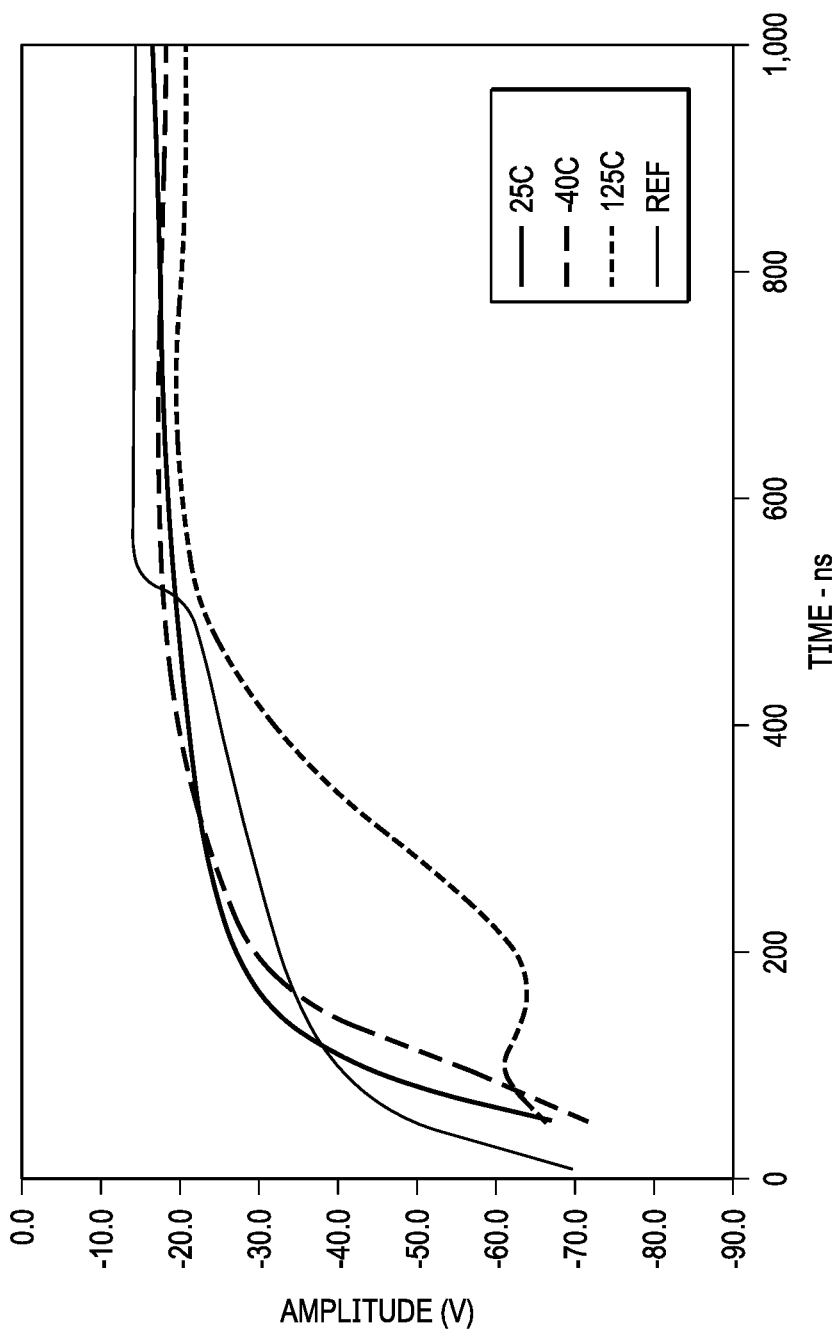
FIG. 3 is measured data plotting the maximum negative voltage amplitude at the SW node (Vswitch-max, y-axis) vs. pulse time (x-axis) for the circuit arrangement shown in FIG. 1B at 25° C., 40° C. and 125° C. with a commercially available reference circuit arrangement (REF) measured at 25° C. including a gate driver with the same half-bridge where the low side LDMOS lacked a floating NISO node.

Disclosed embodiments are further illustrated by the following specific Examples, which should not be construed as limiting the scope or content of this Disclosure in any way. FIG. 3 is measured data plotting the maximum negative voltage amplitude at the SW node 119 (Vswitch-max, y-axis) vs. pulse time (x-axis) for the circuit arrangement shown in FIG. 1B at 25° C., 40° C. and 125° C. with a commercially available reference circuit arrangement measured at 25° C. including a gate driver with the same half-bridge arrangement where the low side LDMOS lacked a floating NISO node also shown as a reference (REF). As described above, the circuit arrangement shown in FIG. 1B includes a disclosed floating NISO LDMOS/DEMOS NMOS transistor 117 as the low side transistor of the HS gate driver 115 having its source coupled to the SW node 119. If the Vswitch-max limits are exceeded, substrate current received from the inductor 125 during switching will flow in the low side transistor of the HS gate driver 115 so that it may not survive or the output waveform may not be as intended.

At relatively long pulse times (>500 ns) at 25° C. the magnitude of Vswitch-max remains at about 20V (−20V) so that at 18V (−18V) the HS gate driver 115 would be ok, but at 22V (−22V) the HS gate driver 115 would likely be damaged. For shorter pulse times the magnitude of Vswitch-max increases, e.g. for 100 ns the Vswitch-max limit is about 45 (−45V) so that at 44V (−44V) the HS gate driver 115 would be ok,—but at 48V (−48V) the HS gate driver 115 would likely be damaged.

The commercially available reference circuit arrangement (REF) measured at 25° C. including a gate driver with the same half-bridge arrangement where the low side LDMOS lacked a floating NISO node 117*g*, with the NISO node believed to be connected to either the boot node or the SW node 119 through a resistor. REF showed Vswitch-max limits generally about 5V lower as compared to the circuit arrangement shown in FIG. 1B (including a disclosed floating NISO LDMOS/DEMOS NMOS transistor 117 as the low side transistor) as seen in FIG. 3 for pulse times from about 100 to 500 nsec. Accordingly, FIG. 3 evidences utilizing a disclosed floating NISO LDMOS/DEMOS NMOS transistor 117 in the circuit arrangement shown in FIG. 1B or similar circuit arrangements subject to significant magnitude negative voltage amplitudes from pulses at the SW node 119 provides superior negative undershoot immunity safe operating area (SOA) curves compared to otherwise equivalent circuit arrangements having the NISO node conventionally connected to a fixed potential.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method, comprising:
providing a first transistor formed in or over a semiconductor substrate doped with a first dopant type, said first transistor including:
a source region doped with a second dopant type;
a drain region including a drain drift region doped with said second dopant type;
a gate stack including a gate electrode on a gate dielectric between said source region and said drain region;
a first isolation region doped with said first dopant type;
said source region and said drain region being enclosed by said first isolation region, and
a second isolation region doped with said second dopant type enclosing said first isolation region;
connecting said drain region of said first transistor to a source of a second transistor, said second isolation region located between said first transistor and said second transistor; and
configuring said second isolation region to be electrically floating in the event said first transistor is operated.

2. The method of claim 1, wherein said first transistor comprises a drain extended metal-oxide-semiconductor (DEMOS) or a laterally diffused metal-oxide-semiconductor (LDMOS) transistor.

3. The method of claim 1, wherein said first transistor comprises an n-channel transistor.

4. The method of claim 1, wherein said first transistor comprises a p-channel transistor.

5. The method of claim 1, wherein said semiconductor substrate has a doping density of less than $5 \times 10^{14}$ cm$^{-3}$.

6. The method of claim 1, wherein said first isolation region extends continuously under said source region, said gate stack and said drain region.

7. The method of claim 1, wherein said configuring said second isolation region comprises omitting any connection between said second isolation region and a conductive terminal.

8. The method of claim 1, wherein said configuring said second isolation region comprises omitting any connection to said second isolation region.

9. The method of claim 1, further comprising forming in or over said semiconductor substrate a level shifter configured to drive said gate electrode of said first transistor and a gate electrode of said second transistor.

10. A semiconductor device, comprising:
a first transistor formed in or over a semiconductor substrate doped with a first dopant type, said first transistor including:
a second level metal layer over the substrate, and a first level metal layer between the second level metal layer and the substrate,
said first level metal layer coupled by a contact to a source region located within the substrate and doped with a second dopant type;
said second level metal layer coupled by a contact to a drain region located within the substrate, said drain region including a drain drift region doped with said second dopant type;
a gate stack located over the substrate, the gate stack including a gate electrode and a gate dielectric, the gate stack being laterally positioned between said source region and said drain region;
said second level metal layer coupled by a contact to a first isolation region doped with said first dopant type;
said source region and said drain region being enclosed by said first isolation region, and
a second isolation region doped with said second dopant type enclosing said first isolation region, wherein said second isolation region is electrically uncoupled so that it electrically floats; and
a second transistor formed in or over said semiconductor substrate connected in series with said first transistor.

11. The semiconductor device of claim 10, wherein said first transistor comprises a drain extended metal-oxide-semiconductor (DEMOS) or a laterally diffused metal-oxide-semiconductor (LDMOS) transistor.

12. The semiconductor device of claim 10, wherein said first transistor comprises an n-channel transistor.

13. The semiconductor device of claim 10, wherein said first transistor comprises a p-channel transistor.

14. The semiconductor device of claim 10, further comprising a level shifter formed in or over said semiconductor substrate coupled to drive said gate electrode of said first transistor and a gate electrode of said second transistor.

15. The semiconductor device of claim 10, wherein said substrate comprises silicon and said gate electrode comprises polysilicon.

16. The semiconductor device of claim 10, wherein said first isolation region extends continuously under said source region, said gate stack and said drain region.

17. A semiconductor device, comprising:
a first transistor formed in or over a semiconductor substrate doped with a first dopant type, said first transistor including:
a second level metal layer over the substrate, and a first level metal layer between the second level metal layer and the substrate,
said first level metal layer coupled by a contact to a source region located within the substrate and doped with a second dopant type;
said second level metal layer coupled by a contact to a drain region located within the substrate, said drain region including a drain drift region doped with said second dopant type;
a gate stack located over the substrate, the gate stack including a gate electrode and a gate dielectric, the gate stack being laterally positioned between said source region and said drain region;
said second level metal layer coupled by a contact to a first isolation region doped with said first dopant type;
said source region and said drain region being enclosed by said first isolation region, and
a second isolation region doped with said second dopant type enclosing said first isolation region, wherein said second isolation region is electrically uncoupled so that it electrically floats;
a second transistor formed in or over said semiconductor substrate connected in series with said first transistor; and
a level shifter formed in or over said semiconductor substrate coupled to drive said gate electrode of said first transistor and a gate electrode of said second transistor.

18. A method, comprising:
forming a first isolation region including a P-type ring extending from a top surface of a P-type semiconductor substrate to a P-type buried layer (PBL) within the substrate;

forming a second isolation region surrounding the first isolation region, the second isolation region including an N-type ring extending from the top surface to an N-type buried layer within the substrate, the PBL being between the N-type buried layer and the top surface;

forming a P-well within the first isolation region that extends from the top surface to the PBL;

forming an N-type drift region between the P-well and the P-type ring;

forming a MOS transistor that includes the N-type drift region;

forming a dielectric layer over the first and second isolation regions and the MOS transistor; and configuring the first isolation region to receive a reference potential during operation of the MOS transistor, and configuring the second isolation region to float during operation of the MOS transistor.

19. An electronic device, comprising:

a first isolation region including a P-type ring extending from a top surface of a P-type semiconductor substrate to a P-type buried layer (PBL) within the substrate;

a second isolation region surrounding the first isolation region, the second isolation region including an N-type ring extending from the top surface to an N-type buried layer within the substrate, the PBL being between the N-type buried layer and the top surface;

a P-well within the first isolation region that extends from the top surface to the PBL;

an N-type drift region between the P-well and the P-type ring; and a MOS transistor that includes the N-type drift region, wherein the first isolation region is configured to receive a reference potential during operation of the MOS transistor, and the second isolation region is configured to electrically float during operation of the MOS transistor.

20. The electronic device of claim 19, further comprising an N+ region at a top surface of the second isolation region.

* * * * *